US011442889B2

(12) United States Patent
Nurvitadhi et al.

(10) Patent No.: US 11,442,889 B2
(45) Date of Patent: Sep. 13, 2022

(54) DYNAMIC DEEP LEARNING PROCESSOR ARCHITECTURE

(71) Applicant: Intel Corporation, Santa Clara, CA (US)

(72) Inventors: Eriko Nurvitadhi, Hillsboro, OR (US); Scott J. Weber, Piedmont, CA (US); Ravi Prakash Gutala, San Jose, CA (US); Aravind Raghavendra Dasu, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 837 days.

(21) Appl. No.: 16/146,886

(22) Filed: Sep. 28, 2018

(65) Prior Publication Data

US 2019/0042529 A1   Feb. 7, 2019

(51) Int. Cl.
*G06F 15/76* (2006.01)
*G06N 3/08* (2006.01)
*G06N 3/063* (2006.01)
*G06N 3/04* (2006.01)

(52) U.S. Cl.
CPC ............... *G06F 15/76* (2013.01); *G06N 3/04* (2013.01); *G06N 3/063* (2013.01); *G06N 3/0635* (2013.01); *G06N 3/082* (2013.01); *G06F 2015/768* (2013.01)

(58) Field of Classification Search
CPC ........ G06N 3/063; G06N 3/04; G06N 3/0635; G06N 3/082; G06F 15/7871; G06F 15/7882; G06F 15/76; G06F 15/78
See application file for complete search history.

(56) References Cited

U.S. PATENT DOCUMENTS

2017/0316312 A1   11/2017   Goyal et al.
2018/0046894 A1   2/2018    Yao

OTHER PUBLICATIONS

Putic, Mateja, et al. "DyHard-DNN: Even more DNN acceleration with dynamic hardware reconfiguration." Proceedings of the 55th Annual Design Automation Conference. Jun. 2018. (Year: 2018).*
Yin, Shouyi, et al. "A high energy efficient reconfigurable hybrid neural network processor for deep learning applications." IEEE Journal of Solid-State Circuits 53.4 (Dec. 2017): 968-982. (Year: 2017).*
Chen, Jun-Hong, Ming-Der Shieh, and Wen-Ching Lin. "A high-performance unified-field reconfigurable cryptographic processor." IEEE transactions on very large scale integration (VLSI) systems 18.8 (2009): 1145-1158. (Year: 2009).*
Cho, Myong Hyon, et al. "Diastolic arrays: throughput-driven reconfigurable computing." 2008 IEEE/ACM International Conference on Computer-Aided Design. IEEE, 2008. (Year: 2008).*

(Continued)

*Primary Examiner* — Benjamin P Geib
(74) *Attorney, Agent, or Firm* — Fletcher Yoder, P.C.

(57) ABSTRACT

Methods and systems for dynamically reconfiguring a deep learning processor by operating the deep learning processor using a first configuration. The deep learning processor then tracking one or more parameters of a deep learning program executed using the deep learning processor in the first configuration. The deep learning processor then reconfigures the deep learning processor to a second configuration to enhance efficiency of the deep learning processor executing the deep learning program based at least in part on the one or more parameters.

18 Claims, 9 Drawing Sheets

(56) References Cited

OTHER PUBLICATIONS

Extended European Search Report for EP Application No. 19183474.6 dated Jun. 26, 2020, pp. 1-9.
Chung, et al., "Serving DNNS in Real Time at Datacenter Scale with Project Brainwave," IEEE Micro, Mar./Apr. 2018, pp. 8-20.
Eldash, et al., "On On-Chip Intelligence Paradigms," 2017 IEEE 30th Canadian Conference on Electrical and Computer Engineering (CCECE), pp. 1-6.
Glette, et al., "Lookup Table Partial Reconfiguration for an Evolvable Hardware Classifier System," 2014 IEEE Congress on Evolutionary Computation (CEC), Jul. 6-11, 2014, Beijing, China, pp. 1706-1713.
Govindaraju, et al., "Dynamically Specialized Datapaths for Energy Efficient Computing," 17th IEEE International Symposium on High Performance Computer Architecture, 2011, pp. 1-12.
Jouppi, et al., "In-Datacenter Performance Analysis of a Tensor Processing Unit," 44th International Symposium on Computer Architecture (ISCA), Toronto, Canada, Jun. 26, 2017, pp. 1-17.
Salvador, et al., "Self-Reconfigurable Evolvable Hardware Syste, for Adaptive Image Processing," IEEE Transactions on Computers, vol. 62, No. 8, Aug. 23, pp. 1481-1493.
Vipin, et al., "FPGA Dynamic and Partial Reconfiguration: A Survey of Architectures, Methods, and Applications," ACM Computing Surveys, vol. 1, No. 1, Article 1, Jan. 2017, pp. 1-39.

\* cited by examiner

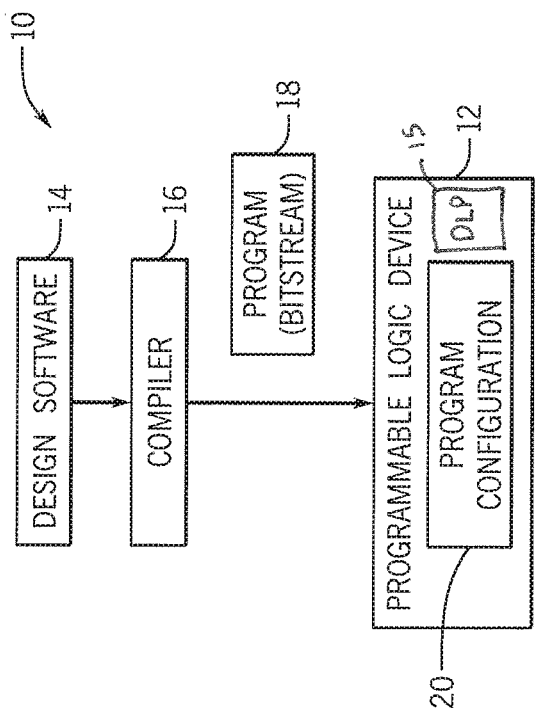
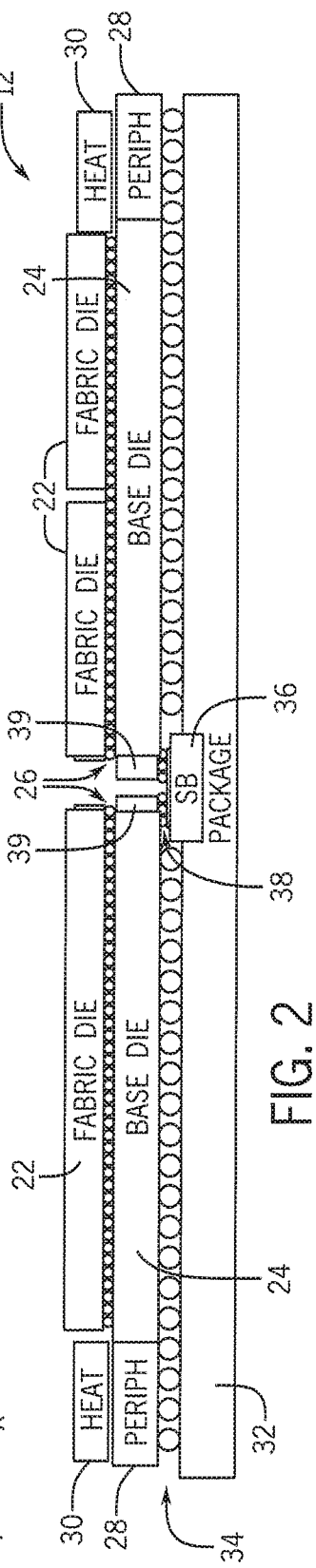
FIG. 1
FIG. 2

DYNAMIC DEEP LEARNING PROCESSOR ARCHITECTURE

BACKGROUND

This disclosure relates to deep learning in deploying and partially reconfiguring a programmable logic fabric of a programmable logic device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. A programmable logic device may include programmable logic elements programmed by a form of memory known as configuration random access memory (CRAM). Thus, to program a circuit design into a programmable logic device, the circuit design may be compiled into a bitstream and programmed into CRAM cells. The values programmed into the CRAM cells define the operation of programmable logic elements of the programmable logic device.

The highly flexible nature of programmable logic devices makes them an excellent fit for accelerating many computing tasks. However, various tasks, such as implementing a static deep learning processor to perform deep learning algorithms, may not utilize the flexibility of the programmable logic devices to adjust to various system demands.

BRIEF DESCRIPTION OF THE DRAWINGS

Various aspects of this disclosure may be better understood upon reading the following detailed description and upon reference to the drawings in which:

FIG. 1 is a block diagram of a programmable logic device that is programmed with a circuit design to implement a deep learning processor, in accordance with an embodiment;

FIG. 2 is a block diagram of a package including the programmable logic device where a fabric die is vertically stacked with a base die, in accordance with an embodiment;

DETAILED DESCRIPTION OF SPECIFIC EMBODIMENTS

Figure 3:
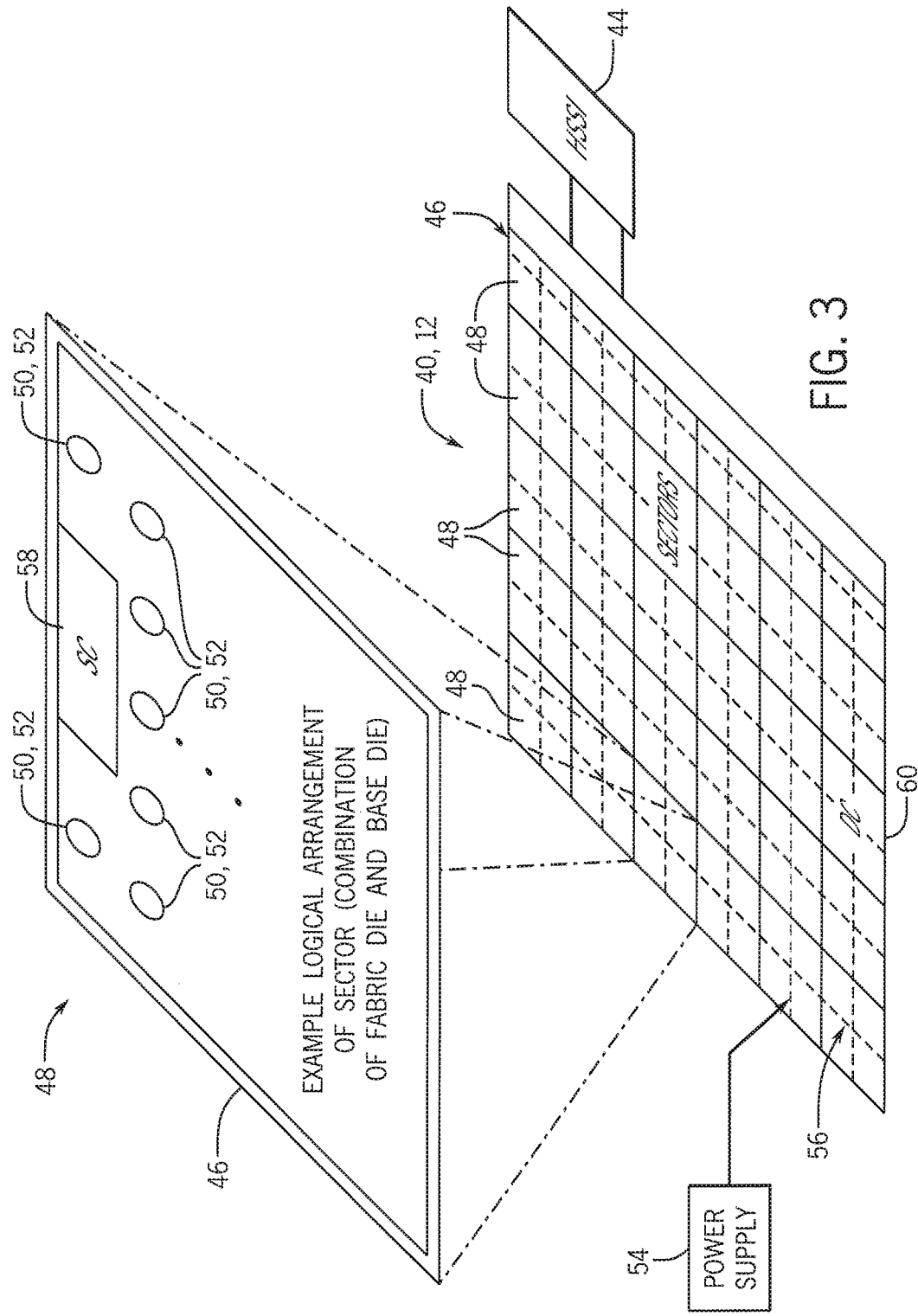
FIG. 3 is a block diagram of an example logical arrangement of the programmable logic device, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Deep learning (DL) algorithms/applications based on neural networks are driving artificial intelligence (AI) innovation. Such DL algorithms rely heavily on tensor processing (matrix/vector operations), which may be compute and data intensive, necessitating highly efficient execution. Moreover, there are many variations and customizations to DL algorithms/applications leading to myriad of computational properties (e.g., throughput-oriented high batch vs. low-latency batch 1, dense vs. sparse neural networks, the use of various numeric precisions, etc.).

To enhance efficiency for DL and accommodate the target variant of DL algorithms/applications of importance, there have been plethora of custom deep learning processor (DLP) hardware architectures in the market. Several examples of types of DL may be used with their respective customized hardware. For example, Google Tensor Processing Unit (TPU)® inference chip may be implemented for high-throughput DL applications using an architecture based on a dense two-dimensional systolic array of processing elements (PEs) on INT8 precision. Also, Microsoft's® Brainwave project targets low latency using broadcast-based PE array architecture on FP11/9/8 precisions. Deephi's Efficient Speech Recognition Engine (ESE) targets sparse DL algorithms, and its architecture is made for sparse matrix formats.

However, these existing architectures employ statically customized architectures (e.g., using application-specific integrated circuits or other implementations) that do not change after deployment. In other words, the custom architecture is chosen at design time for certain type of DL application, such as balancing throughput and latency or selecting between focusing on density and sparsity of data based on anticipated data usage. As such, the DL algorithms may perform inefficiently when there are dynamic variations in the DL algorithms/applications. For example, when DL neural networks employ a mix of sparse and dense layers and/or a mix of degrees of numerical precision, the DL algorithm may perform inefficiently for at least some of the processing. For instance, an architecture configured for dense tensor execution with high precision numerics will not be as efficient when executing layers with sparsity and low precision numerics despite DL applications potentially relying on such dynamic variations.

As discussed below, a dynamically reconfigurable DLP may be deployed to match the dynamically varying natures of DL applications or algorithms. Such dynamic reconfigurability may deliver an overall improved efficiency relative to statically structured DLP architectures. In some embodiments, the DLP may be configurable using a partial reconfiguration (PR) of a programmable logic device used to implement the DLP. The faster the PR time of the programmable logic device, the more optimization opportunities may be exploited by the dynamically configurable DLP. Dynamic reconfiguration of the dynamically configurable DLP is driven by instructions and/or control commands that the DLP executes to implement the changes. The DLP may be generated statically (e.g., via graph compiler) and reconfigured to suit data being analyzed and/or a DL algorithm/ program being used.

Additionally, as discussed below, the dynamically configurable DLP contains self-monitoring capabilities (e.g., performance counters, data monitoring) that are not only usable for run-time profiling and benchmarking, but also may be used by the DLP to self-optimize its configuration by feeding the run-time monitoring information into a self-optimizer sub-system to dynamically reconfigure the DLP to match dynamic demands of the running DL applications. For instance, the dynamically reconfigurable DLP may adjust numerical precision of numbers based on acceptable accuracy target values and/or detect levels of sparsity in analyzed data and deploy the proper dense/sparse architecture for the matrix processing sub-system according to the detected levels of sparsity.

By way of introduction, FIG. 1 illustrates a block diagram of a system 10 that may employ a programmable logic device 12 that can communicate via a network-on-chip disposed on a separate die that does not include programmable logic fabric, in accordance with embodiments presented herein. In some embodiments, the network-on-chip and the programmable logic fabric may be included on a single die. Additionally, the network-on-chip, the programmable logic fabric, and the base die may be included in a single die. Alternatively, the programmable logic fabric die and the base die may be arranged side-by-side (e.g., using a silicon bridge). Using the system 10, a designer may implement a circuit design functionality on an integrated circuit, such as a reconfigurable programmable logic device 12, such as a field programmable gate array (FPGA). The designer may implement a circuit design to be programmed onto the programmable logic device 12 using design software 14, such as a version of INTEL® QUARTUS® by Intel Corporation of Santa Clara, Calif. For instance, as discussed below, the programmable logic device 12 may be used to implement a dynamically reconfigurable deep learning processor (DLP) 15.

The design software 14 may use a compiler 16 to generate a low-level circuit-design defined by bitstream 18, sometimes known as a program object file and/or configuration program that programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform for machine learning, video processing, voice recognition, image recognition, or other highly specialized task.

To carry out the systems and methods of this disclosure, the programmable logic device 12 may take any suitable form to at least partially perform various deep learning algorithms. As such, in one embodiment, the programmable logic device 12 may have two separate integrated circuit die where at least some of the programmable logic fabric is separated from at least some of the fabric support circuitry that operates the programmable logic fabric, which may include a network-on-chip.

One example of the programmable logic device 12 is shown in FIG. 2, but any suitable programmable logic device may be used. In the example of FIG. 2, the programmable logic device 12 includes a fabric die 22 and a base die 24 that are connected to one another via microbumps 26. Although the fabric die 22 and base die 24 appear in a one-to-one relationship in FIG. 2, other relationships may be used. For example, a single base die 24 may attach to several fabric die 22, or several base die 24 may attach to a single fabric die 22, or several base die 24 may attach to several fabric die 22 (e.g., in an interleaved pattern along the x- and/or y-direction). Peripheral circuitry 28 may be attached to, embedded within, and/or disposed on top of the base die 24, and heat spreaders 30 may be used to reduce an accumulation of heat on the programmable logic device 12. The heat spreaders 30 may appear above, as pictured, and/or below the package (e.g., as a double-sided heat sink). The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Although the microbumps 26 and the microbumps 38 are described as being employed between the fabric die 22 and the base die 24 or between the edge devices, such as the silicon bridge 36 and the silicon bridge interface 39, it should be noted that microbumps may be employed at any suitable position between the components of the programmable logic device 12. For example, the microbumps may be incorporated in any suitable position (e.g., middle, edge, diagonal) between the fabric die 22 and the base die 24. In the same manner, the microbumps may be incorporated in any suitable pattern or amorphous shape to facilitate interconnectivity between various components (e.g., NOC) described herein.

In combination, the fabric die 22 and base die 24 may operate as a programmable logic device such as a field programmable gate array (FPGA). For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when the both the fabric die 22 and the base die 24 operate in combination. In other words, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include transceiver circuitry (HSSI) 44 for driving signals off of the FPGA 40 and for receiving signals from other devices. The transceiver circuitry (HSSI) 44 may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48 (e.g., region, portion). Each programmable logic sector 48 may include a number of programmable logic elements 50 (also referred herein as FPGA fabric 50) having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60 and may read data from and write data into its configuration memory 52 based on control signals from the device controller 60. In addition to these operations, the sector controller 58 and/or device controller 60 may be augmented with numerous additional capabilities. Such capabilities may include coordinating memory transactions between local in-fabric memory (e.g., local fabric memory or CRAM being used for data storage), transactions between sector-aligned memory associated with that particular programmable logic sector 48, decrypting configuration data (bitstreams) 18, and locally sequencing reads and writes to implement error detection and correction on the configuration memory 52, and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using HSSI 44 (e.g., pins) and input/output circuitry 42. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may configure the may be applied to the gates of metal-oxide-semiconductor (MOS) transistors that control the states of the programmable logic elements 50 or programmable components of the interconnection resources 46.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50 and configuration memory 52. In some cases, this may also entail certain fabric control circuitry such as the sector controller (SC) 58 or device controller (DC) 60. The base die 24 may include supporting circuitry to operate the programmable logic elements 50 and configuration memory 52. Shown here, the base die 24 includes sector 1 support circuitry 70A and sector 2 support circuitry 70B to support two corresponding sectors of the programmable logic elements 50 and configuration memory 52 of the fabric die 22. The base die 24 may also include support circuitry for other sectors of the fabric die 22.

Thus, while the fabric die 22 may include primarily programmable logic fabric resources, such as the programmable logic elements 50 and configuration memory 52, the base die 24 may include, among other things, a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, to name just a few elements that may be present on the base die 24. It should be understood that some of these elements that may be part of the fabric support circuitry of the base die 24 may additionally or alternatively be a part of the fabric die 22. For example, the device controller (DC) 60 and/or the sector controllers (SC) 58 may be part of the fabric die 22.

Figure 4:
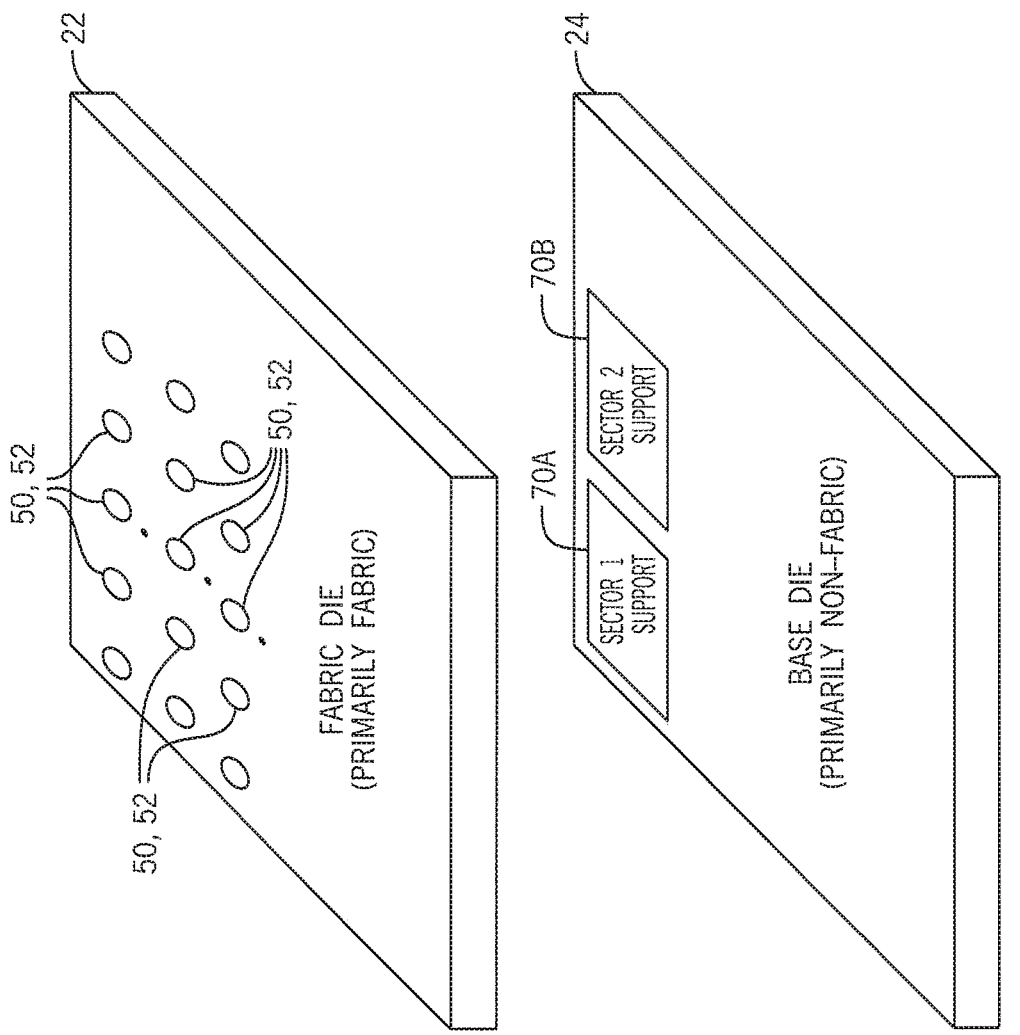
FIG. 4 is a block diagram showing a fabric die of the programmable logic device that contains programmable logic fabric and a base die of the programmable logic device that contains primarily non-fabric circuitry that operates the programmable logic fabric, in accordance with an embodiment.

While FIG. 4 represents an example where the fabric die 22 contains primarily programmable logic fabric, with most other components located in the base die 24, the fabric die 22 may contain some of the other components to support the programmable logic fabric. Thus, in some embodiments, the fabric die 22 or the base die 24 may include one or more of a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, and other elements.

Figure 5:
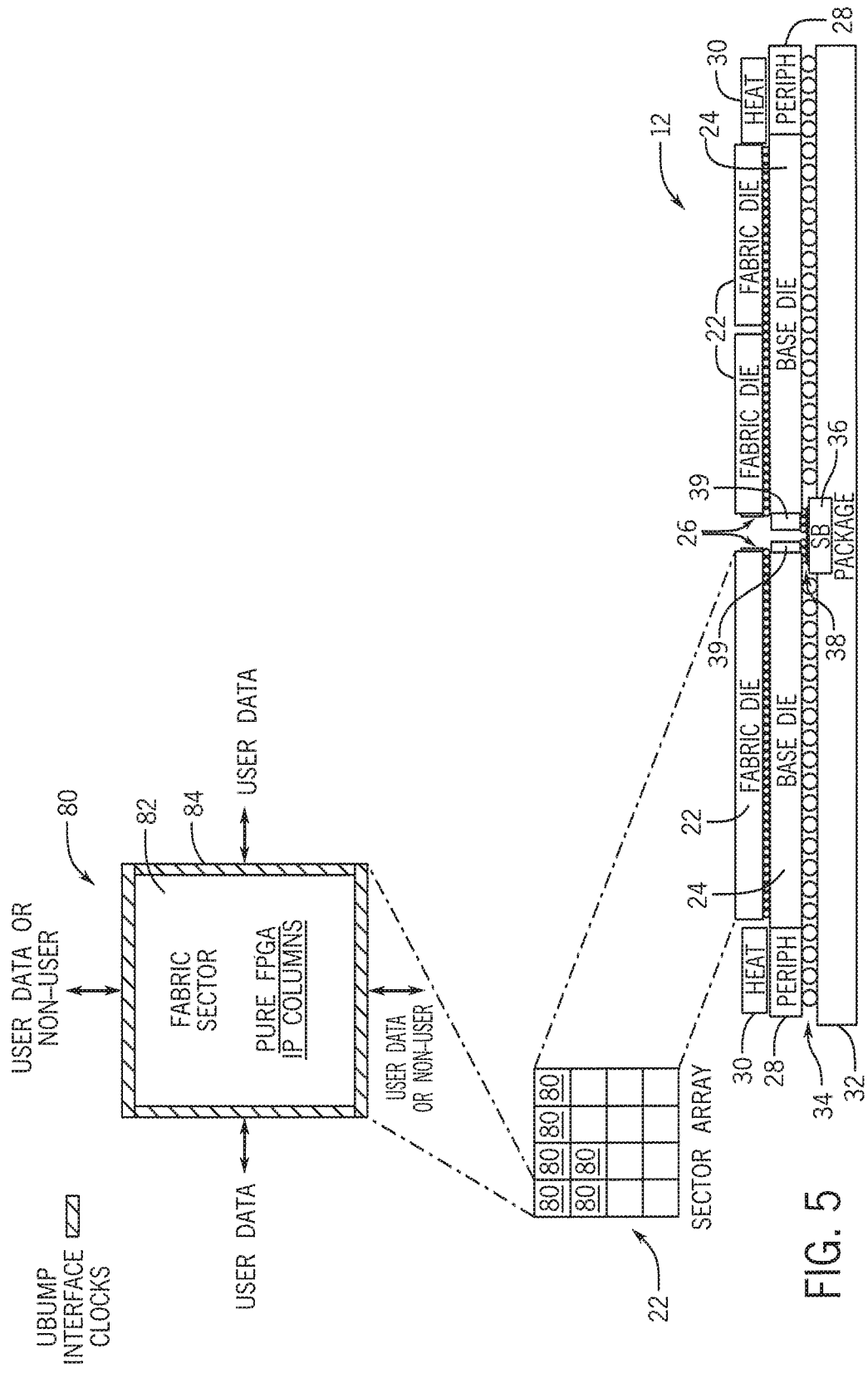
FIG. 5 is a block diagram of an example topology of the fabric die, in accordance with an embodiment.
Figure 6:
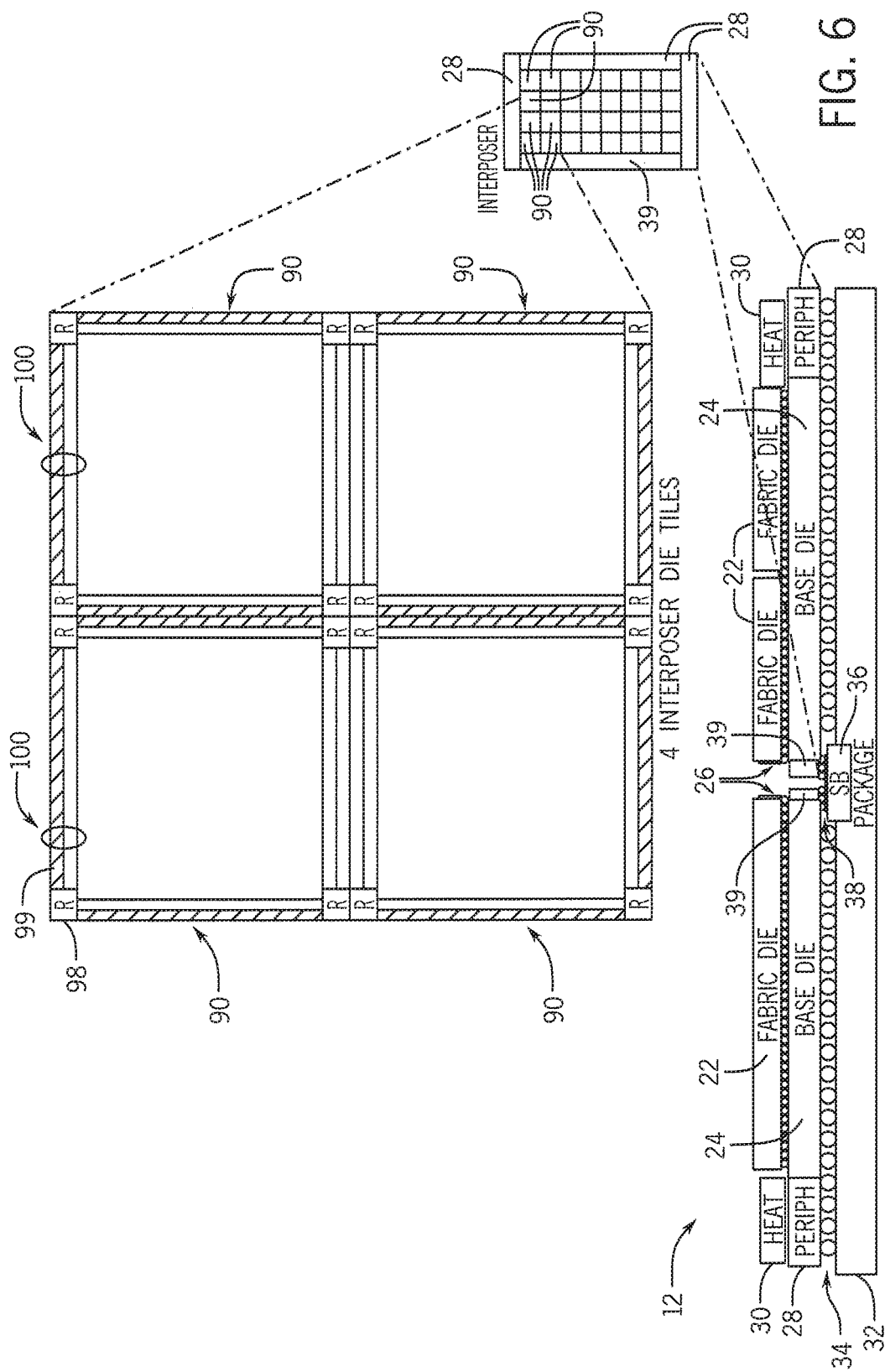
FIG. 6 is a block diagram of an example topology of the base die having an embedded network-on-chip NOC, in accordance with an embodiment.

One example physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources or may include an interface to data routing and/or clocking resources on the base die 24. Thus, the interface circuitry 84 may connect with a micro-bump (ubump) interface to connect to the base die 24.

FIG. 6 provides an example complementary arrangement of the base die 24. The base die 24 may represent an active interposer with several sectors 90 surrounded by peripheral circuitry 28 and the silicon bridge interface 39. Although not shown in FIG. 6, each sector 90 may include a variety of fabric support circuitry, which may described in greater detail below. In any case, the base die 24, in some embodiments, may include data and/or configuration routers 98, and/or data or configuration pathways 99. In some embodiments, portions of the data or configuration pathways 99 may communicate data in one direction, while other portions may communicate data in the opposite direction. In other embodiments, the data or configuration pathways 99 may communicate data bi-directionally.

With the foregoing in mind, the data and/or configuration pathways 99 may make up a network on chip (NOC) system 100. In the embodiment depicted in FIG. 6, the NOC system 100 may be integrated between each sector 90 of the base die 24. As such, the NOC system 100 may enable each of the sectors 90 disposed on the base die 24 to be accessible to each other. Indeed, the NOC system 100 may provide communication paths between each sector 90 via routers 98 or the like. In certain embodiments, the routers 98 may route user data between sectors 90 of the base die 24, to sectors 48 of the fabric die 22, and the like.

In some embodiments, the NOC system 100 may include features such as Quality of Service management, Security Management, Debug and Performance measurement and Address virtualization services, and the like. In addition, the NOC system 100 may support caching features and interconnect protocols allowing the memory components of the programmable logic device 12 to be part of a coherent memory system supported by a caching agent. In other embodiments, the NOC system may be arranged in other formats (e.g., through the sectors 90).

As previously discussed, deep learning processor (DLP) architectures may utilize mixed data compositions. For example, data may include a mixture of different types of numerical precision, such as Bfloat, 16-bit binary floating-point numbers (FP16), 11-bit binary floating-point numbers (FP11), various integer types (e.g., INT8, INT4, ternary numbers, binary numbers, or any other suitable method of representing numbers.

The DL may also have a mix of sparse and dense layers. For instance, incoming data may be dense, but once the incoming data is pruned, the processed data may be relatively sparse.

Furthermore, the DLP architectures may include a mix of neural network types, such as recurrent neural networks (RNN), feed-forward networks (FFN), fully connected (FC) layer-based neural networks, and the like. In some embodiments, the DLP may include computer-generated custom neural networks. Moreover, the DLP architecture may include an ensemble of neural networks that may be heterogeneous or homogenous.

In addition to or alternative to variations of the neural network types and layer sparsity, the DL may have a variety of contextual analyses that change functioning of the DL. For instance, the DL may be applied to images and may analyze parts of an image differently based on what is captured in the image. For instance, if a person is to be analyzed in an image the process may vary from an analysis of a scene. Indeed, the DL may analyze a face differently than other portions of the body.

Multiple tenants utilizing the DLP may further increase complexity of implementing the DLP on an electronic device due to potentially different demands between users. As discussed below, the DLP may adjust according to various parameters of the data and/or the DLP itself rather analyzing data in a static architecture.

Figure 7:
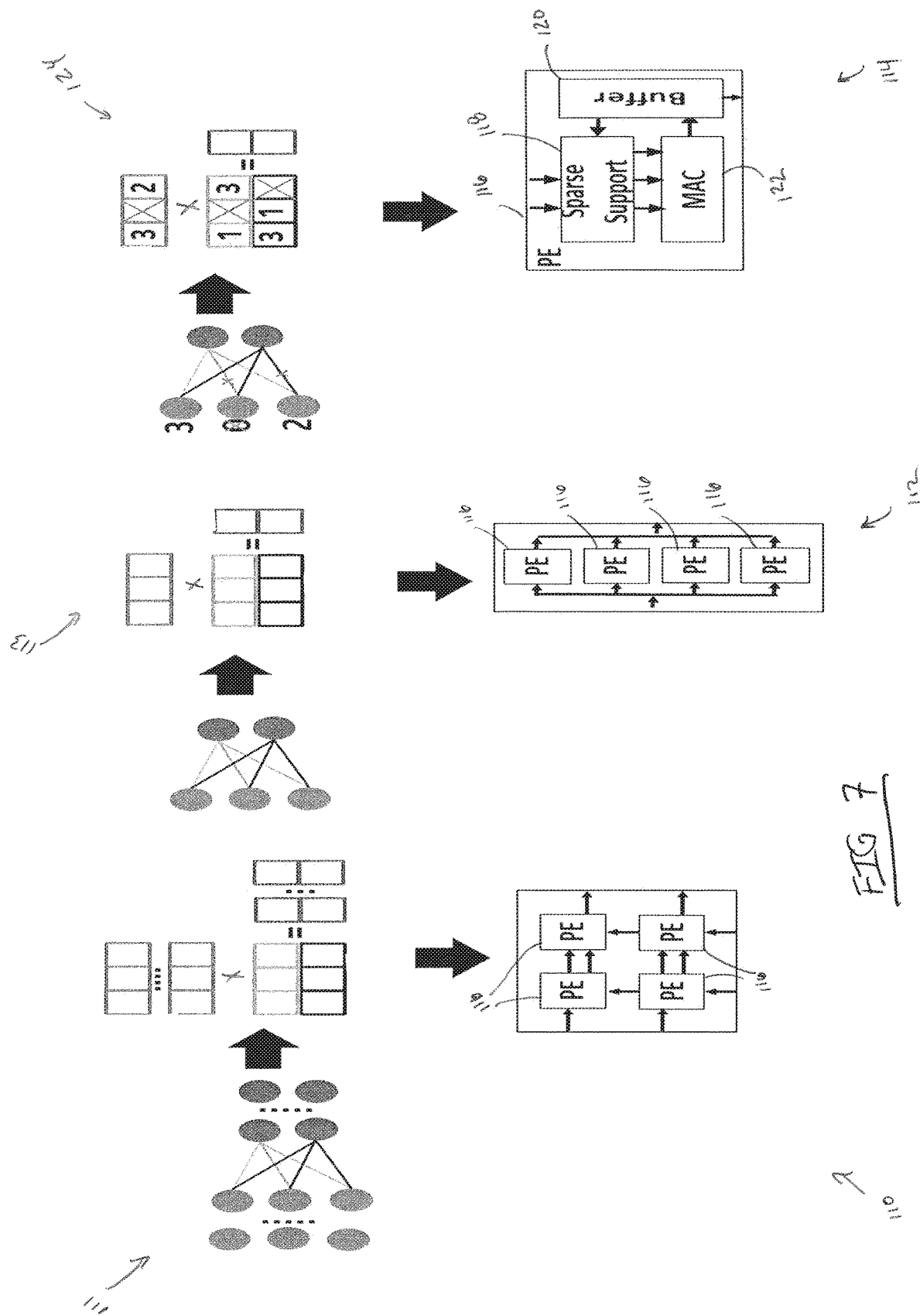
FIG. 7 is a block diagram of various deep learning processor architectures and suitable layers for each architecture, in accordance with an embodiment.

FIG. 7 illustrates block diagrams of DLP architectures 110, 112, and 114 each suitable for various data parameters. For instance, DLP architecture 110 includes a matrix-by-matrix hardware architecture with systolic processing elements (PEs) 116. The DLP architecture 110 may be suitable for maximum compute density and throughput, such as a dense layer 111. The DLP architecture 110 includes a matrix-by-vector hardware architecture with broadcast-based parallel PEs 116 to minimize latency. The DLP architecture 112 may efficiently process low-latency dense layers, such as dense layer 113 The DLP architecture 114 includes individual PEs 116 that are configured to efficiently process sparse matrices using sparse support circuitry 118, a buffer 120, and a multiply-and-accumulate (MAC) 122. The sparse support circuitry 118 may compress the sparse matrices into compressed sparse matrices. The buffer 120 and/or the MAC 122 together may be used by the PE 116 to operate on the compressed sparse matrices, such as the sparse layer 124. If the DLP architectures 110, 112, and 114 are used other types of DLs than the optimized type, the DL may be inefficient.

The programmable logic device 12 may be used to implement a DLP utilizing a dynamic architecture to implement DL. Overall, the proposed DLP may be dynamically programmed and optimized to accommodate a myriad of architecture optimizations for modern DL algorithms. Using the DLP framework discussed below, the available architectures may also be continuously enhanced as libraries of new DLP sub-systems/components are developed.

Figure 8:
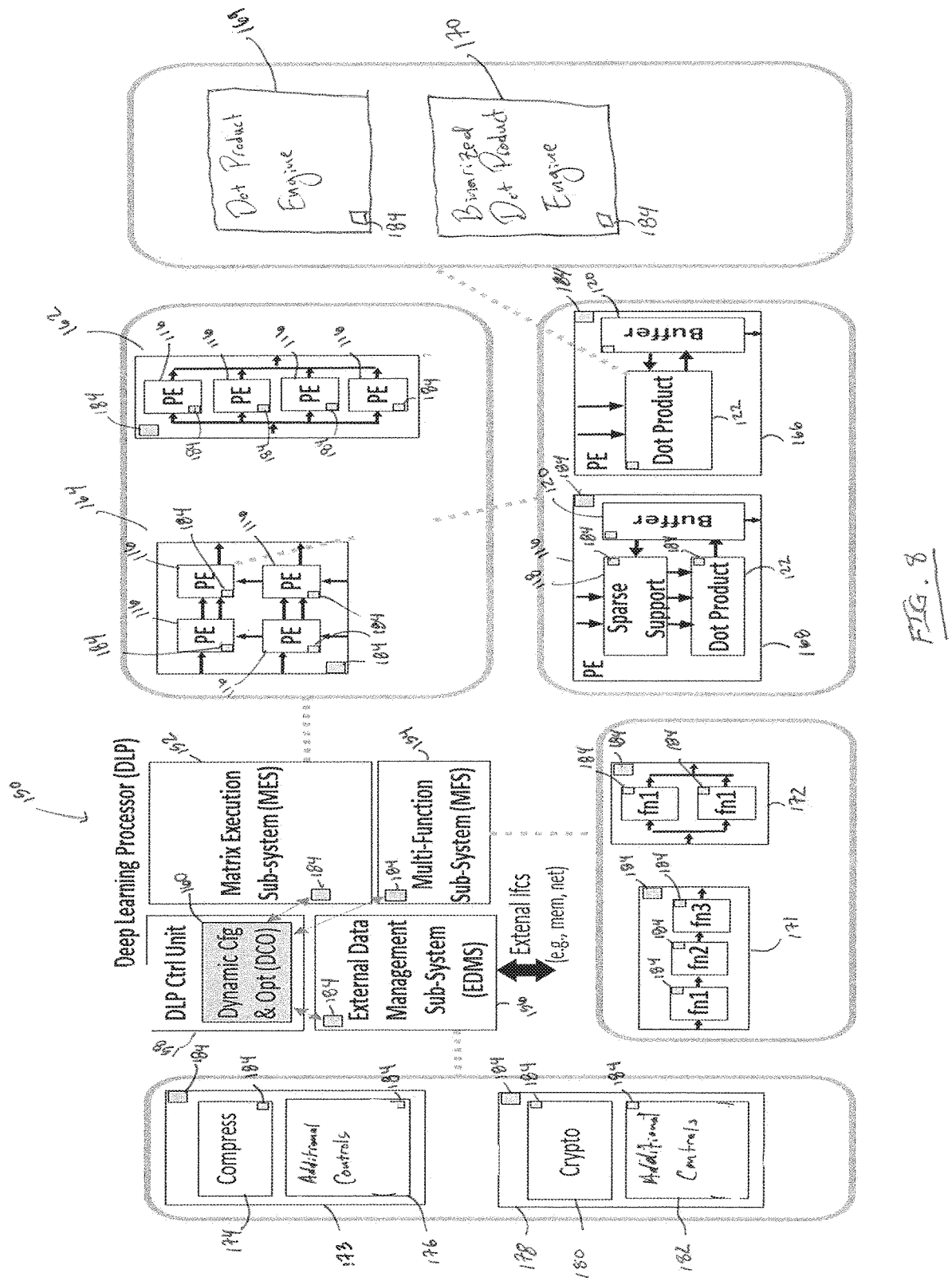
FIG. 8 is a block diagram of an example topology of a deep learning processor and related circuitry, in accordance with an embodiment.

While the discussion herein relates to deep learning, the DLP is efficient in tensor processing and may have applicability in other application domains that rely on tensor processing. FIG. 8 illustrates a block diagram of a DLP architecture 150. As stated previously, the DLP architecture includes sub-systems. For instance, a first sub-system may include a matrix processing sub-system (MES) 152. Moreover, a second sub-system may include a multi-function processing sub-system (MFS) 154 for activation functions, scaling, normalization, and the like. Another sub-system may include a data management subsystem (EDMS) 156 that interfaces external devices (e.g., with a memory or network). Yet another sub-system may include a DLP configuration unit (DCU) 158 that manages and co-ordinates execution across the sub-systems.

The DCU 158 includes a dynamic configuration and optimization (DCO) 160. The DCO 160 drives reconfiguration on the DLP sub-systems. Specifically, the reconfiguration is driven by a statically provided DLP program (e.g., instructions and/or control commands) executed by the DCO 160. In some embodiments, the DLP architecture may be generated by a graph compiler from a target DL application described in a high-level DL framework. An instruction/command in the DLP program may invoke reconfiguration of one or more of the sub-systems. For instance, a matrix-by-vector instruction may trigger a reconfiguration of the MES 152 to load a broadcast-based configuration 162 from a systolic configuration 164 for processing elements 116. Unlike a static approach, such dynamic configuration allows for more types of DLP instructions to be supported. As discussed below, dynamic optimization decisions that are made based on runtime profiling and decision making of the DCO 160.

Additionally or alternatively, the DCO 160 may cause the MES 152 to load a a dense configuration 166 for dense matrices and/or a sparse configuration 168 for sparse matrices for one or more PEs 116.

The DCO 160 may also cause the MES 152 to configure one or more PEs 116 to perform specific functions. For example, the DCO 160 may cause the MES 152 to load a dot product engine 169 to generate a standard dot product using one or more PEs 116. Additionally or alternatively, the DCO 160 may cause the MES 152 to load a binarized dot product engine 170 to generate a binarized dot product using one or more PEs 116. The DCO 160 may also control timing and/or order of functions. For instance, the DCO 160 may cause the MES 152 to load a series of functions 171 or parallel implementation of a single function 172 depending on various rules corresponding to the respective DL.

Additionally or alternatively, the DCO 160 may dynamically configure sub-systems of the electronic device other than the MES 152. For instance, the DCO 160 may cause the EDMS 156 to load a compression configuration 173 that utilizes compression circuitry 174 to compress data before external transmission to an external device (e.g., to a memory or network). The compression configuration 173 may also include additional circuitry/controls 176, such as a scratchpad or external controls to/from an external device (e.g., memory or network) coupled to the EDMS 156.

Additionally or alternatively, the DCO 160 may cause the EDMS 156 to load a cryptographic configuration 178 that utilizes cryptographic circuitry 180 to encrypt data before external transmission to an external device (e.g., to a memory or network). The cryptographic configuration 178 may also include additional circuitry/controls 182, such as a scratchpad or external controls to/from an external device (e.g., memory or network) coupled to the EDMS 156. The additional circuitry/controls 182 and 176 may be same between the compression configuration 173 and the cryptographic configuration 178 or may be different between the compression configuration 173 and the cryptographic configuration 178.

The DLP architecture 150 also illustrates a distributed set of profiling and optimizer (PO) components 184 throughout the DLP. The PO components 184 gather runtime information about performance of the DLP. For instance, the PO components 184 may track and/or report performance bottlenecks, algorithm numerics, or other parameters that may be used to measure efficiency of the DLP architecture 150 for the DL being run on the DLP architecture 150. As discussed below, the PO components 184 may accompany and be embedded within the architectural components stored in a library.

A profiler component performs runtime monitoring of certain target metrics. An optimizer component utilizes such runtime information to uncover dynamic optimization opportunities through architectural customizations. Non limiting examples of profiler components may relate to performance, data, and/or numerics.

Performance-related profiling components may include sensors to track and profile stalls or available bandwidth in the DLP. An integrated and/or related optimizer component may then attempt to improve bandwidth utilization with a configuration change (e.g., via a partial configuration of the FPGA fabric 50).

Data-based profilers may track and profile certain patterns and values of data (e.g., zeroes, inessential values, repeated values, etc.). An integrated and/or related optimizer component may attempt to exploit the patters. For instance, the optimizer component may attempt to compress repeated values or skipping computing for inessential values.

Numerics-based profilers may track and profile accuracies, saturation, and rounding events in numbers. An integrated and/or related optimizer component may attempt to optimize to tolerable numerics outcomes based on set thresholds, context-based thresholds, and/or user-defined thresholds.

Additionally or alternatively, the DLP may attempt to optimize its own performance based on other factors, such as precision, data sparsity, problem dimensions, and/or other suitable performance factors. For instance, the DLP may dynamically adjust to a minimal precision to improve efficiency while maintaining a tolerable precision based on set thresholds, context-based thresholds, and/or user-defined thresholds.

The DLP may additionally or alternatively dynamically adjust to match sparsity of data to obtain efficiency by moving most compact data and skipping inessential computations. The DLP may also additionally or alternatively dynamically match architecture with problem dimensions (e.g., tall, skinny matrix versus short, wide matrix) to improve processing efficiency with improved throughput and/or latency.

Using the PO components 184 in the DLP, and abiding to the user-provided inputs on the target DL applications and their deployment constraints, dynamic optimization strategies can be chosen for the DLP.

Through dynamic reconfiguration, the various subsystems may be morphed to utilize different architectures. Although some examples are provided in FIG. 8, these examples are non-limiting. Indeed, any suitable DLP architectures may be adjusted into the DLP architecture 150 using the DCO 160. In some embodiments, these reconfiguration components are kept on the programmable logic device 12 in a partial reconfiguration storage.

Figure 9:
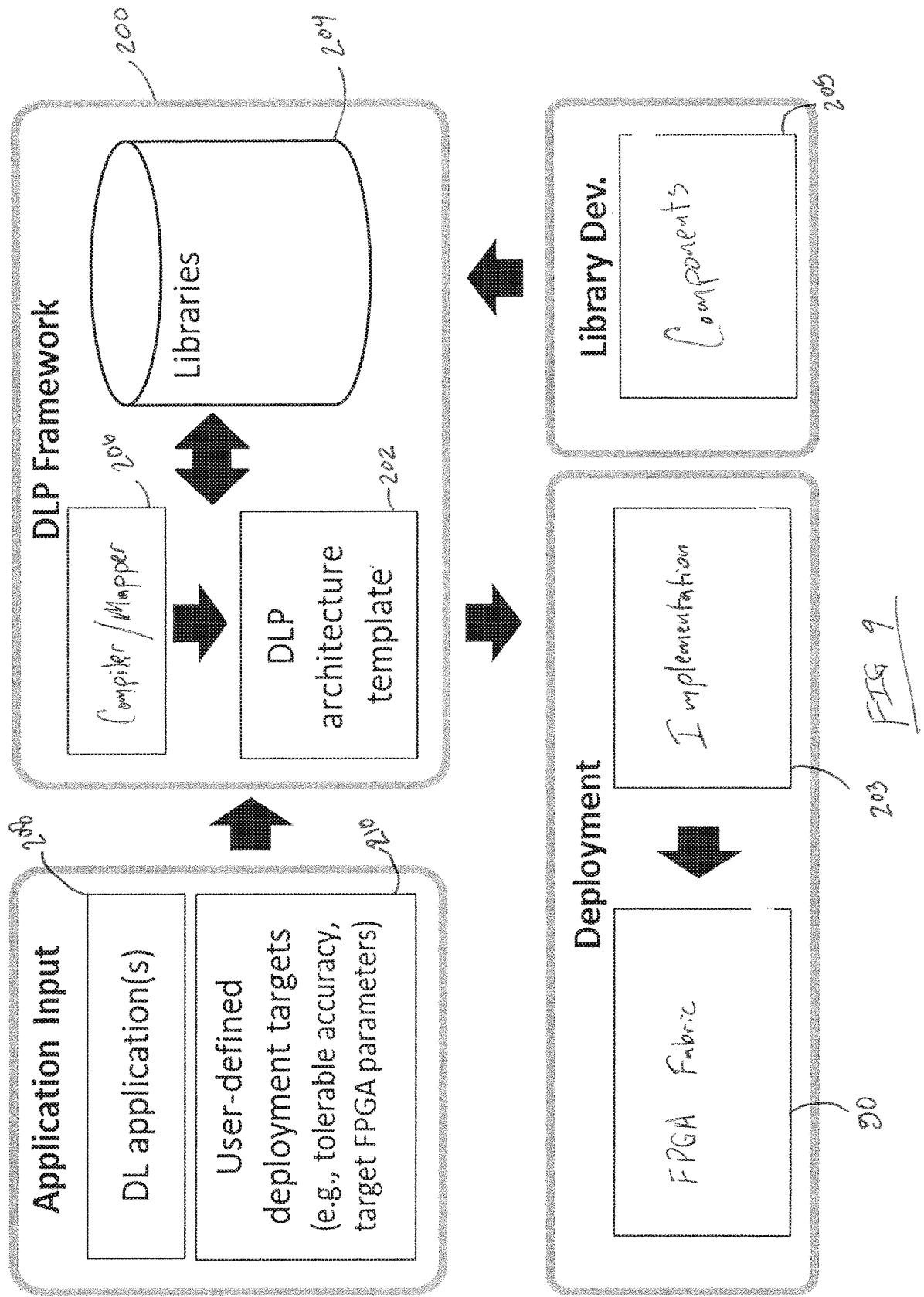
FIG. 9 is a block diagram of a framework used to implement the deep learning processor, in accordance with an embodiment.

FIG. 9 illustrates a block diagram of a framework 200 for the DLP. The framework 200 includes a DLP architecture template 202. The template 202 may be the DLP architecture 150 that is parameterized to accept different sets of components that may be deployed to the various sub-systems dynamically according to various profiles and/or optimizations determined by the DCO 160 using the PO components 184. For instance, the parameters in the template 202 may be dynamically assigned using data from the PO components 184 and loaded into the FPGA fabric 50 via DLP implementation 203 using the DCO 160. The implementation 203 may utilize hardware instances, software programs, or a combination thereof to implement the template 202.

The framework 200 may also include one or more libraries 204. For instance, the one or more libraries 204 may be stored in one or more databases. The one or more libraries 204 contain architecture components 205 of the DLP that may be inserted into the parameterized portions of the template 202. For instance, the architecture components 205 may contain sub-systems, PEs 116, arithmetic units, functions, or other components that may deployed in the DLP architecture 150. The one or more libraries 204 may also store one or more PO components 184 for these architecture components. The one or more libraries 204 may be developed and/or supplemented by hardware developers and DL optimizing users that design/optimize the architecture components 205.

The architecture components may be stored in the one or more libraries 204 in any suitable format that may be used to cause the DCO 160 to load the corresponding components into the FPGA fabric 50.

The framework 200 may also include a compiler/mapper 206. The compiler/mapper 206 may be used to map a given DL application onto a DLP program. As previously noted, a DLP program may include a set of instructions and/or control commands for the DLP to execute a target DL application 208 that may include a particular type of deep learning. In the compilation and mapping, the compiler/mapper 206 may also consider user-defined deployment targets 210. For instance, a user may specify a tolerable accuracy of the DL application 208, target FPGA parameters, and/or other parameters of implementing the DL application 208.

The framework 200 produces a DLP hardware instance tailored for the DL application(s) 208. The framework 200 is equipped with a set of architecture components 205 and contains the compiled DLP software program used to configure the FPGA fabric 50. At deployment, the soft DLP hardware is configured onto the target FPGA fabric 50, and the one or more libraries 204 are loaded onto the partial reconfiguration memory of the programmable logic device 12. The DLP then executes its program to run the DL application 208. At runtime, the program may invoke partial reconfiguration to reconfigure the DLP sub-systems dynamically. Furthermore, the PO components 184 may also detect dynamic optimization opportunities and invoke dynamic reconfiguration of the DLP sub-systems via the DCO 160 as well. In other words, the DLP architecture 150 may be self-optimizing.

Due the changeable nature of the DLP architecture 150, the architecture components 205 may be developed hand-in-hand to capture certain sets of architectural customizations for certain classes of DL applications that may be deployed to the FPGA fabric 50 quickly.

Figure 10:
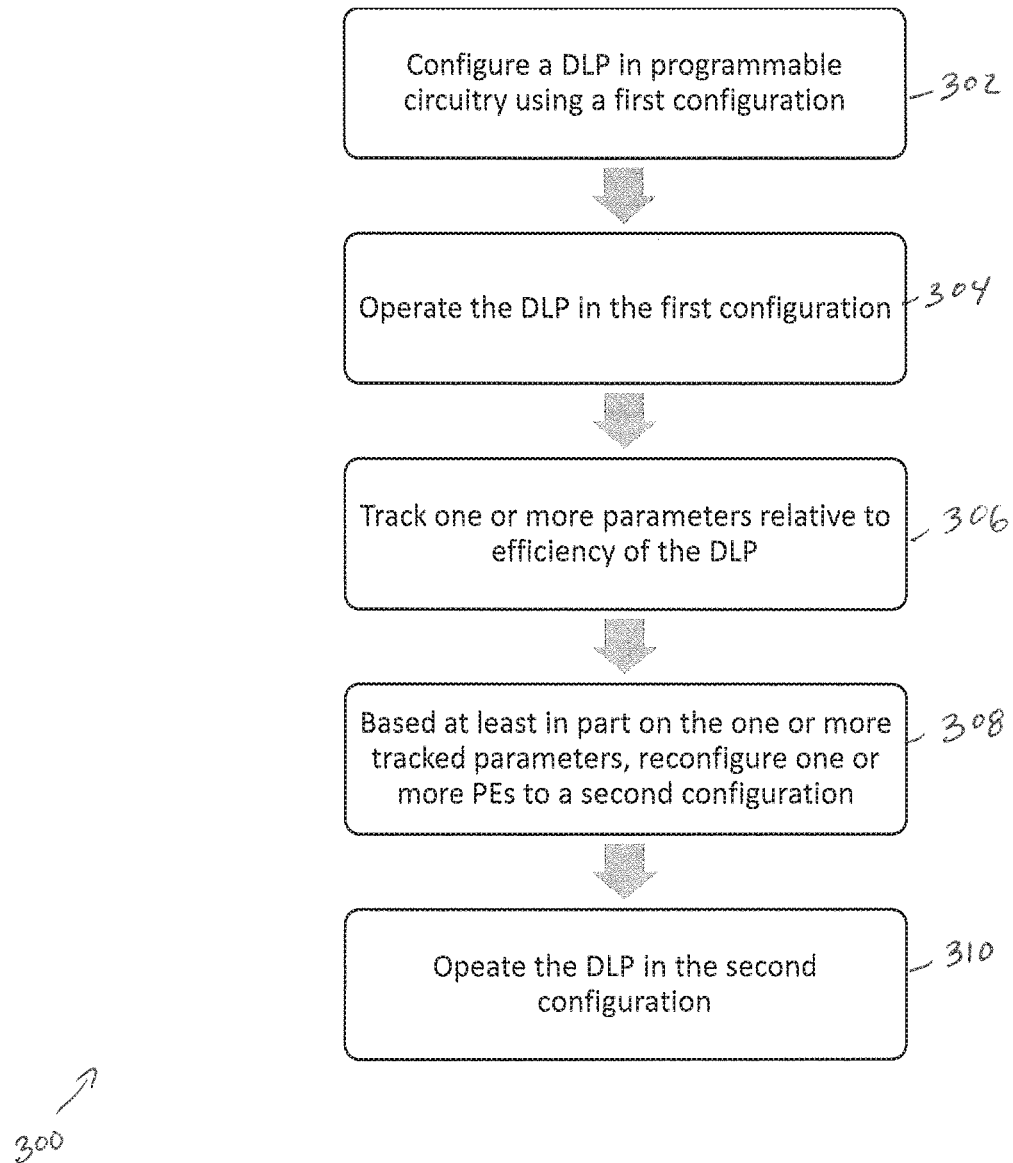
FIG. 10 is a flow diagram of a process used to dynamically reconfigure the deep learning processor, in accordance with an embodiment.

FIG. 10 is a flow diagram of a process 300 that may be used to employ a dynamically reconfigurable deep learning processor in programmable logic devices. The deep learning processor may be implemented in a first configuration (block 302). The first configuration denotes and controls an architecture of the DLP 150. In some embodiments, the DLP 150 may have a default configuration used to implement the deep learning processor in the programmable logic device 12. The DLP 150 then operates in the first configuration (block 304). The DLP 150, via PO components 184, may track one or more parameters of a deep learning program (block 306). These parameters may include any suitable parameters relative to the efficiency of the DLP 150 including, but not limited to, bandwidth, throughput, data sparsity, compression settings, cryptographic settings, types of functions to be deployed, parallel v. series implementations of one or more functions to be deployed, and the like.

Based at least in part on the one or more tracked parameters, the DLP 150 may reconfigure one or more processing elements (PEs) 116 to a second configuration to enhance efficiency of the deep learning processor executing the deep learning program (block 308). Reconfiguring the one or more processing elements may include a partial reconfiguration or a complete reconfiguration of the FPGA fabric 50 implementing the PEs 116. Moreover, reconfiguring the one or more PEs 116 may include reconfiguring connections between the one or more PEs 116 and/or reconfiguring behavior in at least some of the PEs 116 themselves. The reconfiguration may be completed by replacing parameters of the template 202 with stored configurations in the library (ies) 204. The reconfigured one or more PEs 116 then more efficiently execute the deep learning program (block 310). Reconfiguration of the PEs 116 may be performed iteratively and/or after any period of operation of a previous configuration whenever the DLP 150 determines that any available efficiency may be achieved. In other words, the DLP 150 may determine that efficiency may be improved (e.g., by maximizing throughput) from the second configuration for a particular executed deep learning program. Thus, during a next available reconfiguration period, the DLP 50 may reconfigure at least some of the PEs 116 using a third configuration. In some embodiments, the first and third configurations may be same configurations.

Although the foregoing discusses optimization and optimizers, optimization as used herein includes maximizing efficiency or merely increasing efficiency by any degree.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An integrated circuit device comprising:
    a deep learning processor comprising:
        a matrix execution circuitry that couples to and configures one or more processing elements of a programmable fabric, wherein the matrix execution circuitry comprises configuration memory to store configurations and to load the configurations as configuring the one or more processing elements; and
        an instruction-based controller configured to:
            monitor one or more parameters of a deep learning algorithm implemented in the deep learning processor, wherein the one or more parameters comprises sparsity of data analyzed b the deep learning processor; and
            based at least in part on the one or more monitored parameters, reconfigure the one or more processing elements to increase efficiency of the deep learning processor.

2. The integrated circuit device of claim 1, wherein the deep learning processor is implemented in a programmable logic device.

3. The integrated circuit device of claim 2, wherein the programmable logic device comprises a programmable fabric that includes the one or more processing elements.

4. The integrated circuit device of claim 3, wherein reconfiguring the one or more processing elements comprises partially reconfiguring the programmable fabric at runtime without reconfiguring the entire programmable fabric.

5. The integrated circuit device of claim 2, wherein the programmable logic device comprises a field-programmable gate array.

6. The integrated circuit device of claim 1, wherein the deep learning processor comprises an external data management sub-system that controls an interface with an external device external to the integrated circuit device using a programmable fabric.

7. The integrated circuit device of claim 6, wherein the instruction-based controller configures the interface via the external data management sub-system to include to compress transmissions to the external device.

8. The integrated circuit device of claim 6, wherein the instruction-based controller configures the interface via the external data management sub-system to include to cryptographically secure transmissions to the external device.

9. The integrated circuit device of claim 1, wherein reconfiguring the one or more processing elements comprises reconfiguring connections between the one or more processing elements.

10. The integrated circuit device of claim 1, wherein reconfiguring the one or more processing elements comprises internal portions of the processing elements.

11. The integrated circuit device of claim 10, wherein reconfiguring the one or more processing elements comprises selecting an engine between a standard dot product engine and a standardized dot product engine and configuring the one or more processing elements with the selected engine.

12. The integrated circuit device of claim 11, wherein when the data analyzed comprises a sparse matrix, reconfiguring the one or more processing elements—includes sparse support circuitry of the one or more processing elements that compresses the sparse matrix for processing by one or more processing elements.

13. A method comprising:
    operating deep learning processor using a first configuration;
    tracking one or more parameters of a deep learning program using the deep learning processor in the first configuration, wherein the one or more parameters comprises sparsity of data analyzed by the deep learning processor; and
    reconfiguring one or more processing elements of a programmable fabric of the deep learning processor to a second configuration to enhance efficiency of the deep learning processor executing the deep learning program based at least in part on the one or more parameters.

14. The method of claim 13, wherein tracking the one or more parameters comprises latency of the deep learning processor.

15. The method of claim 14, wherein reconfiguring the deep learning processor comprises reconfiguring the deep learning processor to decrease latency when the latency has exceeded a threshold by reconfiguring the deep learning processor to arrange a broadcast configuration of one or more processing elements in a parallel configuration.

16. The method of claim 14, wherein the one or more parameters comprises a stall in execution of the deep learning program, and reconfiguring the deep learning processor comprises reconfiguring the deep learning processor to increase throughput when throughput has dropped below a threshold by reconfiguring the deep learning processor to arrange a two-dimensional systolic configuration of one or more processing elements.

17. Tangible, non-transitory, and computer-readable medium having instructions stored thereon instructions, that when executed, are configured to cause a deep learning processor to:
  configure the deep learning processor in a first configuration;
  operate the deep learning processor using the first configuration;
  track one or more parameters of a deep learning program using the deep learning processor in the first configuration, wherein the one or more parameters comprises sparsity of data analyzed by the deep learning processor; and
  based on the one or more tracked parameters, reconfigure one or more processing elements of a programmable fabric to a second configuration to enhance efficiency of the deep learning processor executing the deep learning program.

18. The tangible, non-transitory, and computer-readable medium of claim 17, wherein the deep learning processor comprises a multi-function sub-system that controls configuration of multiple functions in the one or more processing elements, wherein a first configuration comprises a series different functions implemented in the one or more processing elements, and a second configuration comprises parallel execution of a single function in the one or more processing elements.

* * * * *